United States Patent
Watanabe (10) Patent No.: US 8,614,921 B2
(45) Date of Patent: Dec. 24, 2013

(54) NONVOLATILE SEMICONDUCTOR MEMORY DEVICE

(75) Inventor: Yasuaki Watanabe, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 150 days.

(21) Appl. No.: 12/929,798

(22) Filed: Feb. 16, 2011

(65) Prior Publication Data

US 2011/0235440 A1 Sep. 29, 2011

(30) Foreign Application Priority Data

Mar. 25, 2010 (JP) ................................ 2010-069522

(51) Int. Cl.
*G11C 16/06* (2006.01)

(52) U.S. Cl.
USPC ............... 365/185.2; 365/185.21; 365/189.07

(58) Field of Classification Search
USPC .............................. 365/189.07, 185.2, 185.21
See application file for complete search history.

(56) References Cited

U.S. PATENT DOCUMENTS

| | | | | |
|---|---|---|---|---|
| 5,420,822 A | * | 5/1995 | Kato et al. ..................... | 365/218 |
| 5,592,427 A | * | 1/1997 | Kumakura et al. ............ | 365/205 |
| 6,323,693 B1 | * | 11/2001 | Park ............................... | 327/56 |
| 2005/0213363 A1 | * | 9/2005 | Oga ............................... | 365/145 |
| 2006/0133171 A1 | * | 6/2006 | Tonda ............................ | 365/210 |
| 2010/0220519 A1 | * | 9/2010 | Kim ............................... | 365/163 |

FOREIGN PATENT DOCUMENTS

JP 2003-331599 11/2003

* cited by examiner

*Primary Examiner* — Huan Hoang
(74) *Attorney, Agent, or Firm* — McGinn Intellectual Property Law Group, PLLC (57) ABSTRACT

A nonvolatile semiconductor memory device includes: a sense amplifier; bit lines coupled to the sense amplifier; memory cell transistors and dummy cell transistors coupled in parallel with the bit lines; and a current generating circuit that supplies a test current to current nodes. Either of the source and the drain of each of the dummy cell transistors is coupled to a bit line and the other is coupled to a current node. In a read operation test, the current generating circuit is activated and then the dummy cell transistors are turned on. The sense amplifier compares the test current passed through a bit line with a reference current and outputs output data corresponding to the result of the comparison.

10 Claims, 8 Drawing Sheets

| INPUT | | | OUTPUT | |
|---|---|---|---|---|
| TST | A1 | A0 | WL3-0 | RWL |
| L | L | L | LLLH | L |
| L | L | H | LLHL | L |
| L | H | L | LHLL | L |
| L | H | H | HLLL | L |
| H | * | * | LLLL | H |

| INPUT | | | | OUTPUT | |
|---|---|---|---|---|---|
| TST | A2 | A1 | A0 | WL3-0 | RWL |
| L | L | L | L | LLLH | L |
| L | L | L | H | LLHL | L |
| L | L | H | L | LHLL | L |
| L | L | H | H | HLLL | L |
| L | H | * | * | LLLL | H |
| H | * | * | * | LLLL | H |

FIG. 10

NONVOLATILE SEMICONDUCTOR MEMORY DEVICE

CROSS-REFERENCE TO RELATED APPLICATIONS

The disclosure of Japanese Patent Application No. 2010-69522 filed on Mar. 25, 2010 including the specification, drawings, and abstract is incorporated herein by reference in its entirety.

BACKGROUND

1. Field of the Invention

The present invention relates to nonvolatile semiconductor memory devices and in particular to a read operation test for nonvolatile semiconductor memory devices.

2. Description of Related Art

As an electrically erasable/programmable nonvolatile semiconductor memory device, flash memories and charge trapping memories are known. In such a nonvolatile semiconductor memory device, a transistor having a charge storage layer is used as a memory cell. When an electron is injected into a charge storage layer, the threshold voltage of the memory cell transistor is increased. When an electron is extracted from a charge storage layer, the threshold voltage of the memory cell transistor is reduced. The magnitude of this threshold voltage is correlated with stored data "1" or "0."

At the time of data readout, a predetermined read voltage is applied to the gate of the memory cell transistor. The memory cell transistor whose threshold voltage is low (hereafter, referred to as "ON cell") is turned on and a cell current (ON cell current) flows. Meanwhile, the memory cell transistor whose threshold voltage is high (hereafter, referred to as "OFF cell") is turned off and a cell current hardly flows. Whether a memory cell transistor is an ON cell or an OFF cell, that is, stored data can be determined by comparing the cell current with a predetermined reference current using a sense amplifier.

Rewriting (writing, erasing) of data is carried out by injecting an electron into a charge storage layer or extracting an electron therefrom. However, as rewriting of data is repeated, a memory cell transistor is deteriorated and its ON cell current is reduced. For this reason, there is a possibility that normal data readout at a maximum guaranteed frequency is impossible in the stage of practical use thought it is possible immediately after manufacture.

To prevent this problem, a "read operation test" is conducted before product shipment. Specifically, it is determined whether or not data can be accurately read at a maximum guaranteed frequency even after a memory cell transistor is deteriorated. When data is accurately read, the test result is PASS and the product is judged "non-defective." When data is not accurately read, the test result is FAIL and the product is judged "defective." This read operation test is also designated as "read speed margin judgment test."

One of techniques for implementing a read operation test with cell deterioration taken into account is to simulatedly bring the memory cell transistors in products into a state after deterioration. Specifically, the threshold voltage of a memory cell transistor is adjusted so that the ON cell current of the memory cell transistor is brought to a predetermined level (level after cell deterioration). For this purpose, short-time writing or erasing is carried out on the memory cell transistor. However, the writing time or the erasing time it takes for the ON cell current to reach the predetermined level varies from memory cell transistor to memory cell transistor because of production tolerance or the like. For this reason, it is necessary to repeat short-time writing or erasing a large number of times while checking the ON cell current point by point. This incurs increase in test time and manufacturing cost.

Japanese Patent Application Publication No. 2003-331599 describes a technique for shortening a time required for read operation tests. Description will be given to the technique described in Japanese Patent Application Publication No. 2003-331599 with reference to FIG. 1.

Figure 1:
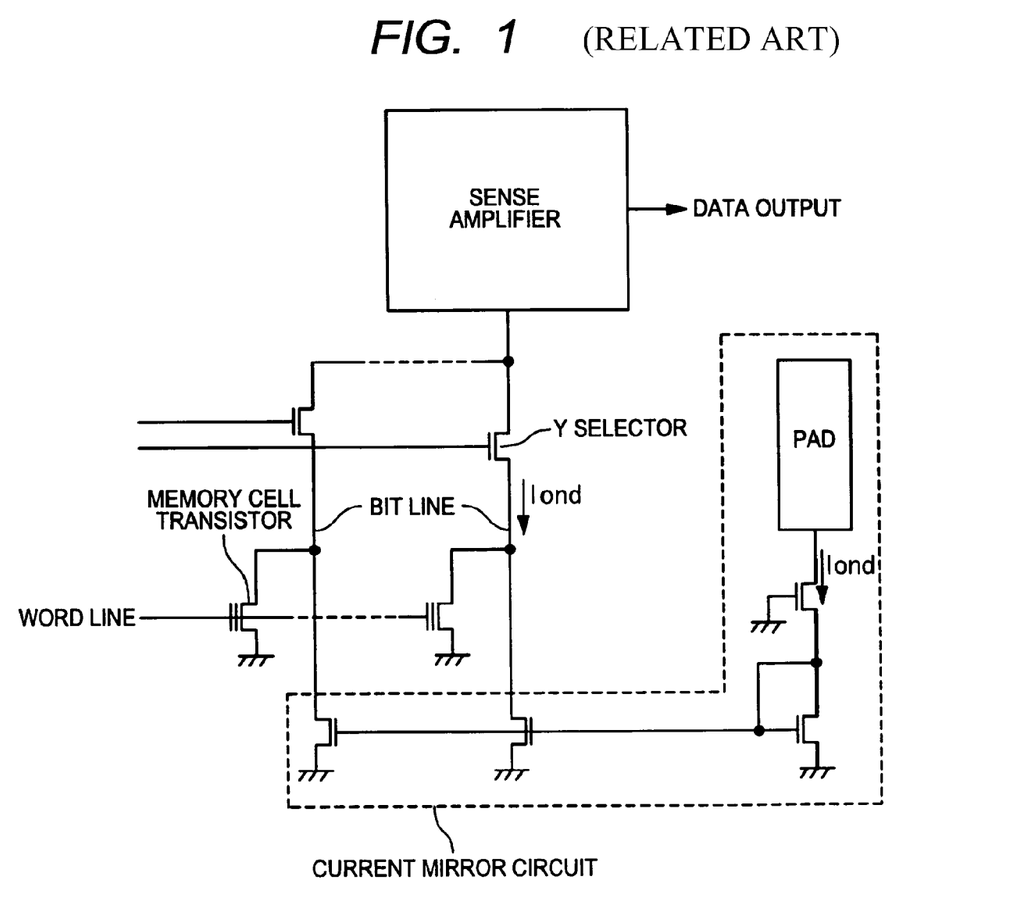
FIG. 1 is a circuit diagram illustrating the configuration of a nonvolatile semiconductor memory device according to a related technology.

Each memory cell transistor is coupled to a sense amplifier through a bit line and a Y selector. Further, each bit line is coupled with a current mirror circuit. This current mirror circuit is provided to "simulatedly" pass an ON cell current after deterioration through each bit line. More detailed description will be given. When test voltage is applied to an external terminal PAD, a simulated ON cell current Iond is produced in the current mirror circuit. The magnitude of ON cell current of the deteriorated memory cell is measured beforehand and the test voltage is set so that the simulated ON cell current Iond becomes equal to the ON cell current of the deteriorated memory cell.

In a read operation test, all the memory cell transistors are turned off and the above test voltage is applied to the external terminal PAD. As a result, the simulated ON cell current Iond is passed through each bit line. The sense amplifier compares the simulated ON cell current Iond with a reference current and outputs data corresponding to the result of the comparison. A read operation test with cell deterioration taken into account can be carried out by passing a simulated ON cell current Iond using a current mirror circuit as mentioned above. Since it is unnecessary to actually establish a deteriorated state, a test time is shortened.

SUMMARY

The present inventors paid attention to the following point. In the technique described with reference to FIG. 1, actual data readout operation is not accurately replicated in the read operation test. That is, the read operation test is not accurate. This incurs degradation in yield or reliability.

More detailed description will be given. How an ON cell current rises depends on change in the voltage of a word line coupled to the gate of the relevant memory cell transistor. That is, in actual data readout operation, an ON cell current increases with rise in word line voltage. Reference code "Cr" in FIG. 2 denotes the ON cell current in data readout operation.

In FIG. 1, meanwhile, how the simulated ON cell current Iond rises is determined by the resistance or capacitance parasitic on the external terminal PAD or the operation speed of the current mirror circuit. Rise in word line voltage is not reflected therein. Reference code "Ct" in FIG. 2 denotes this simulated ON cell current Iond. In general, the charging speed of an external terminal PAD and the operation speed of a current mirror are lower than the rate of rise in word line voltage. For this reason, rise in Ct is slower than rise in Cr as shown in FIG. 2.

Figure 2:
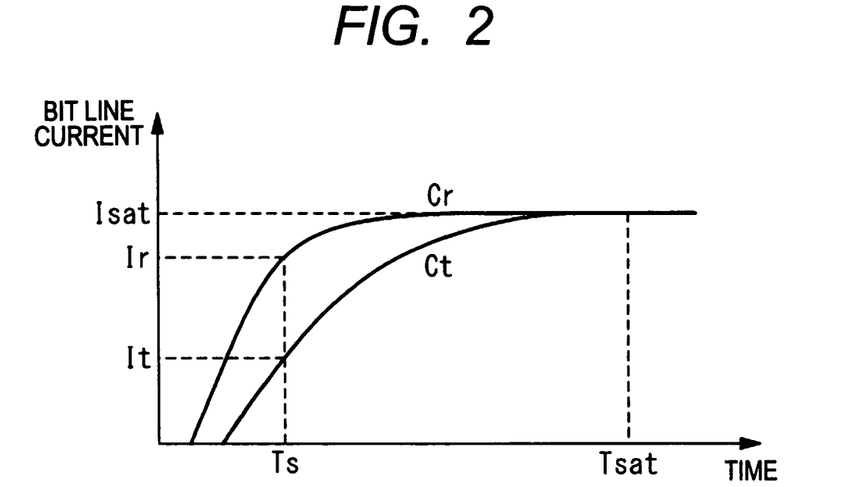
FIG. 2 is a drawing explaining a problem.

Reference code "Ts" in FIG. 2 denotes a sensing time when the sense amplifier compares a bit line current with a reference current. At sensing time Ts, the current value It of Ct (during testing) is lower than the current value Ir of Cr (at the time of actual data readout). This means that the data readout test is conducted under severer conditions than in actual data readout. This increases a probability that a non-defective is erroneously judged defective. This incurs degradation in yield.

At time Tsat, both the magnitude of Cr and that of Ct take a saturation value Isat and agree with each other. Therefore, sensing operation could be carried out at time Tsat in a data readout test. However, the saturation value Isat is usually higher than the current value Ir at the actual sensing time Ts. This means that the data readout test is conducted under looser conditions than in actual data readout. Therefore, a probability that a defective is erroneously judged non-defective is increased. This incurs degradation in reliability.

In case of the technique described with reference to FIG. 1, as described up to this point, the accuracy of the read operation test is not sufficient and there is apprehension that yield or reliability is degraded. It is desired to enhance the accuracy of read operation tests.

In an embodiment of the invention, a nonvolatile semiconductor memory device includes: a sense amplifier; bit lines coupled to the sense amplifier; memory cell transistors and dummy cell transistors coupled in parallel with the bit lines; and a current generating circuit that supplies a test current to current nodes. Either of the source and the drain of each dummy cell transistor is coupled to a bit line, and the other is coupled to a current node. In a read operation test, the current generating circuit is activated and then a dummy cell transistor is turned on. The sense amplifier compares the test current passed through each bit line with a reference current and outputs output data corresponding to the result of the comparison.

According to the invention, the accuracy of read operation tests on nonvolatile semiconductor memory devices is enhanced.

DETAILED DESCRIPTION

Description will be given to embodiments of the invention with reference to the accompanying drawings.

1. First Embodiment 1-1. Configuration

Figure 3:
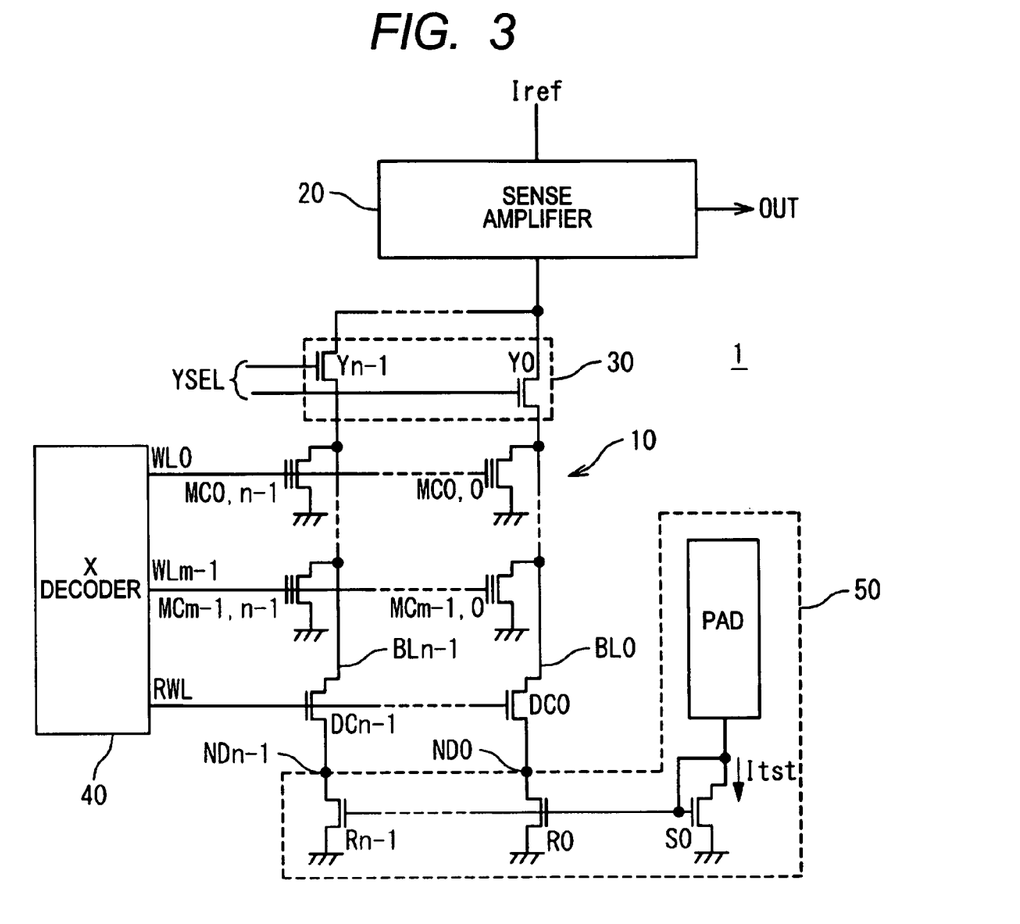
FIG. 3 is a circuit diagram illustrating the configuration of a nonvolatile semiconductor memory device in a first embodiment of the invention.

FIG. 3 illustrates the nonvolatile semiconductor memory device 1 which includes a cell array 10, a sense amplifier 20, a Y selector 30, an X decoder 40, and a current generating circuit 50.

The cell array 10 includes word lines WLx (x=0 to m−1), bit lines BLy (y=0 to n−1), and memory cell transistors MCx,y. The word lines WLx and the bit lines BLy are so arranged that they are orthogonal to each other. The memory cell transistors MCx,y are placed at the intersections therebetween.

Each of the memory cell transistors MCx,y is a transistor having a charge storage layer and functions as a memory cell that stores data. Each of the memory cell transistors MCx,y is, for example, a MONOS (Metal Oxide Nitride Oxide Silicon) transistor. The MONOS transistor is a kind of MIS (Metal Insulator Silicon) transistor. As a gate insulating film thereof, an ONO (Oxide Nitride Oxide) film obtained by laminating a silicon oxide film, a silicon nitride film, and a silicon oxide film in this order is used. The gate of each of the memory cell transistors MCx,y is coupled to a word line WLx. Either of the source and the drain of each of the memory cell transistor MCx,y is coupled to a bit line BLy and the other is grounded.

The cell array 10 further includes dummy cell transistors DCy (y=0 to n−1) and a dummy word line RWL. The gate of each of the dummy cell transistors DCy is coupled to the dummy word line RWL. Either of the source and the drain of each of the dummy cell transistors DCy is coupled to a bit line BLy and the other is coupled to a current node NDy. That is, the memory cell transistors MCx,y and the dummy cell transistors DCy are coupled in parallel with bit lines BLy.

Each of the dummy cell transistors DCy preferably has the same "gate capacitance" as the memory cell transistors MCx,y. For example, each of the dummy cell transistors DCy has the same structure as that of each of the memory cell transistors MCx,y. That is, when each of the memory cell transistors MCx,y has a MONOS structure, it is desirable that each of the dummy cell transistors DCy should have a MONOS structure. In this case, each of the dummy cell transistors DCy is set as an ON cell through which an ON current can be passed. However, the dummy cell transistors DCy need not have the same structure as that of the memory cell transistors MCx,y.

The sense amplifier 20 is coupled to the bit lines BLy through the Y selector 30. In data readout operation, the sense amplifier 20 compares the bit line current Ibit passed through a selected bit line BLs with a reference current Iref and outputs output data OUT corresponding to the result of the comparison.

The Y selector 30 electrically couples a selected bit line BLs specified by a Y select signal YSEL to the sense amplifier 20. In more detail, the Y selector 30 includes select transistors Yy (y=0 to n−1) placed between the bit lines BLy and the sense amplifier 20. The individual bits of the Y select signal YSEL are inputted to the respective gates of the select transistors Yy (y=0 to n−1). As a result, a select transistor Ys coupled to a selected bit line BLs is turned on.

The X decoder 40 is coupled to the word lines WLx and the dummy word line RWL. The X decoder 40 selects a selected word line from among the word lines WLx and the dummy word line RWL and applies driving voltage to that selected word line. When driving voltage is applied to the selected word line, the ON cells MCx,y or the dummy cell transistors DCy coupled to the selected word line are turned on.

Figure 4:
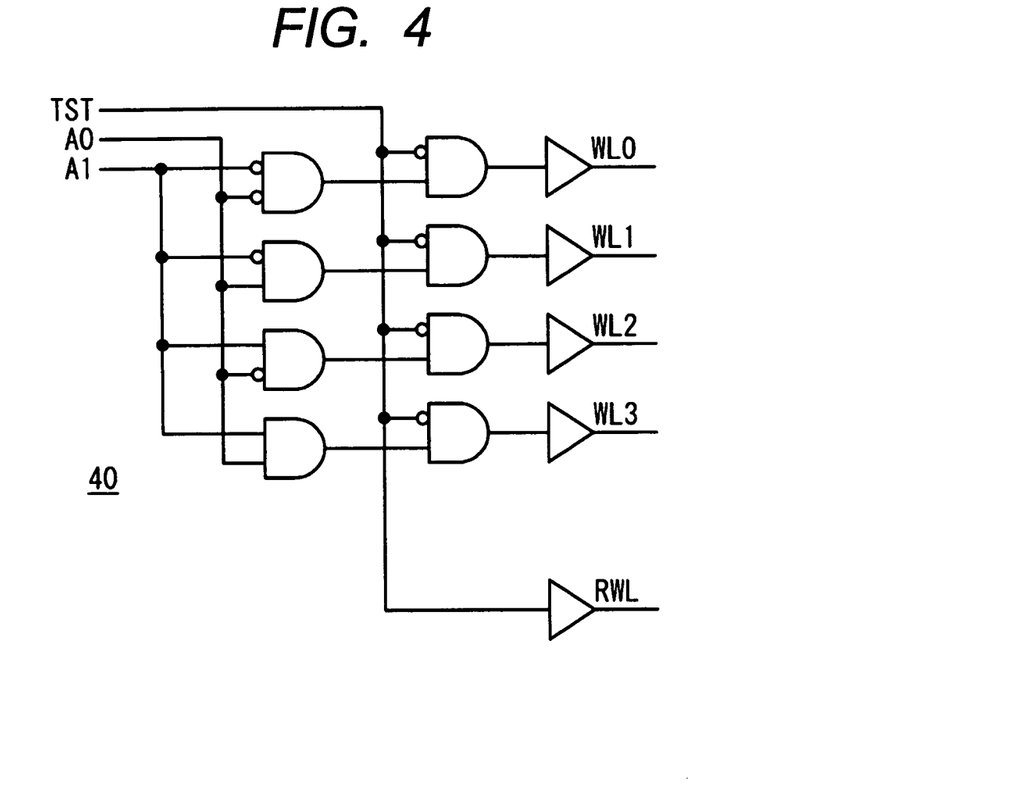
FIG. 4 is a circuit diagram illustrating an example of the configuration of the X decoder in the first embodiment.
Figure 5:
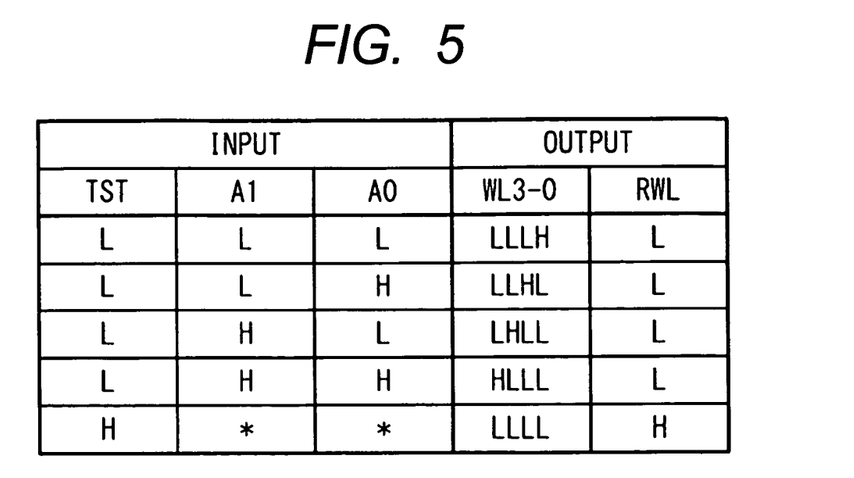
FIG. 5 is the truth table of the X decoder in the first embodiment.

FIG. 4 illustrates an example of the configuration of the X decoder 40 in this embodiment. FIG. 5 illustrates the truth table of the X decoder 40 in this embodiment. FIG. 4 and FIG. 5 shows a case where m=4 as an example. Reference codes [A1, A0] denote address signals specifying any one of word lines WL0 to WL3. Reference code TST denotes a test signal specifying a read operation test.

In usual data readout operation, the test signal TST is set to the Low level (L). In this case, the X decoder 40 decodes the address signals [A1, A0] and selects any one of the word lines WL0 to WL3 as the selected word line. At this time, the dummy word line RWL is in a non-selected state. In a read operation test, meanwhile, the test signal TST is set to the High level (H). In this case, the X decoder 40 selects the dummy word line RWL as the selected word line and brings all the word lines WL0 to WL3 into a non-selected state regardless of the address signals [A1, A0].

The current generating circuit 50 is coupled to all the current nodes NDy. In a read operation test, the current generating circuit 50 supplies a test current Itst to the current nodes NDy. The magnitude of the test current Itst is equal to the magnitude of the ON cell current passed through a deteriorated memory cell transistor MCx,y.

As illustrated in FIG. 3, for example, the current generating circuit 50 is comprised of a current mirror circuit. Specifically, the current generating circuit 50 includes an external terminal PAD, a transistor S0, and transistors Ry (y=0 to n−1). The drain of each of the transistors Ry is coupled to a current node NDy. The gate of each of the transistors Ry is coupled to the gate of the transistor S0. The drain of the transistor S0 is coupled to the gate of the transistor S0 and the external terminal PAD. When the mirror ratio between the transistors Ry and the transistor S0 is 1, the test current Itst is inputted to the external terminal PAD. As a result, the current generating circuit 50 can supply the test current Itst to the current nodes NDy.

The configuration of the current generating circuit 50 is not limited to that illustrated in FIG. 3. The current generating circuit 50 may internally generate the test current Itst.

1-2. Operation 1-2-1. Usual Data Readout Operation

In data readout operation, the test signal TST is set to the Low level as inactive level. The Y selector 30 couples a selected bit line BLs corresponding to the Y select signal YSEL to the sense amplifier 20. The X decoder 40 selects a selected word line WLs corresponding to address signals and applies driving voltage to that selected word line WLs. When the selected cell transistor MCs coupled to a selected bit line BLs and a selected word line WLs is an "ON cell," an ON cell current is passed through the selected bit line BLs. Meanwhile, when the selected cell transistor MCs is an "OFF cell," a cell current is hardly passed through the selected bit line BLs. The sense amplifier 20 compares the bit line current Ibit passed through the selected bit line BLs with the reference current Iref and outputs output data OUT corresponding to the result of the comparison.

1-2-2. Read Operation Test

Figure 6:
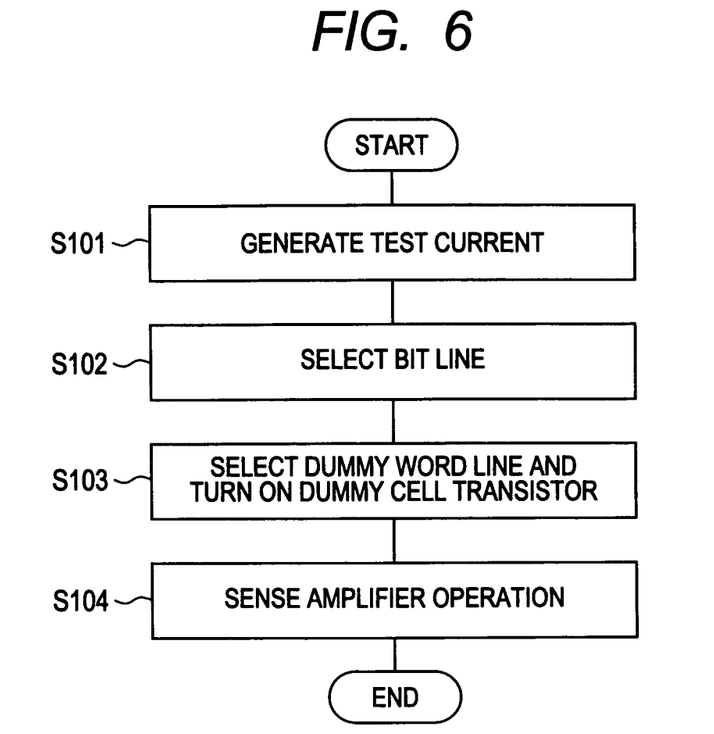
FIG. 6 is a flowchart illustrating a read operation test in the first embodiment.

FIG. 6 is a flowchart illustrating a read operation test in this embodiment.

Step S101:

First, the current generating circuit 50 is activated and the test current Itst is generated. In the case of the example in FIG. 3, the desired test current Itst is inputted to the external terminal PAD. As a result, the current generating circuit 50 applies the test current Itst to the current nodes NDy. The magnitude of the test current Itst is equal to the magnitude of the ON cell current of the deteriorated memory cell.

Step S102:

The Y selector 30 selects any bit line BLy as the selected bit line BLs according to the Y select signal YSEL. Then the Y selector 30 electrically couples the selected bit line BLs to the sense amplifier 20.

Step S103:

The test signal TST is set to the High level as active level. As a result, the X decoder 40 selects the dummy word line RWL and applies driving voltage to the dummy word line RWL. Meanwhile, the X decoder 40 brings all the word lines WLx into a non-selected state. As a result, the dummy cell transistors DCy are turned on and all the memory cell transistors MCx,y are turned off.

The selected bit line BLs is electrically coupled to a current node NDs through a dummy cell transistor DCs. As a result, the test current Itst starts to flow through the selected bit line BLs and the dummy cell transistor DCs between the sense amplifier 20 and the current node NDs. At this time, how the test current Itst passed through the selected bit line BLs is determined by how the driving voltage of the dummy word line RWL rises. As a result, the same way of rising as in actual data readout operation is realized.

It is desirable that each of the dummy cell transistors DCy should have the same "gate capacitance" as that of each of the memory cell transistors MCx,y. In this case, the dummy word line RWL and the word lines WLx have substantially the same capacitance. As a result, how the test current Itst rises in the read operation test is substantially identical with how the ON current rises in data readout operation. That is, change in bit line current at the time of actual data readout is substantially perfectly replicated.

Step S104:

The sense amplifier 20 compares the test current Itst passed through the selected bit line BLs with the reference current Iref with predetermined timing. Then the sense amplifier 20 outputs output data OUT corresponding to the result of the comparison. When output data OUT as expected is outputted, the test result is PASS. When the output data OUT is different from an expected value, the test result is FAIL.

1-3. Effect

According to this embodiment, in a read operation test, how the test current Itst passed through the selected bit line BLs rises is identical with that in actual data readout operation. Therefore, the accuracy of the read operation test is enhanced. As a result, the yield and reliability of the nonvolatile semiconductor memory device 1 are enhanced.

2. Second Embodiment

Description will be given to the second embodiment of the invention. Description overlapping with that of the first embodiment will be omitted as appropriate.

2-1. Configuration

Figure 7:
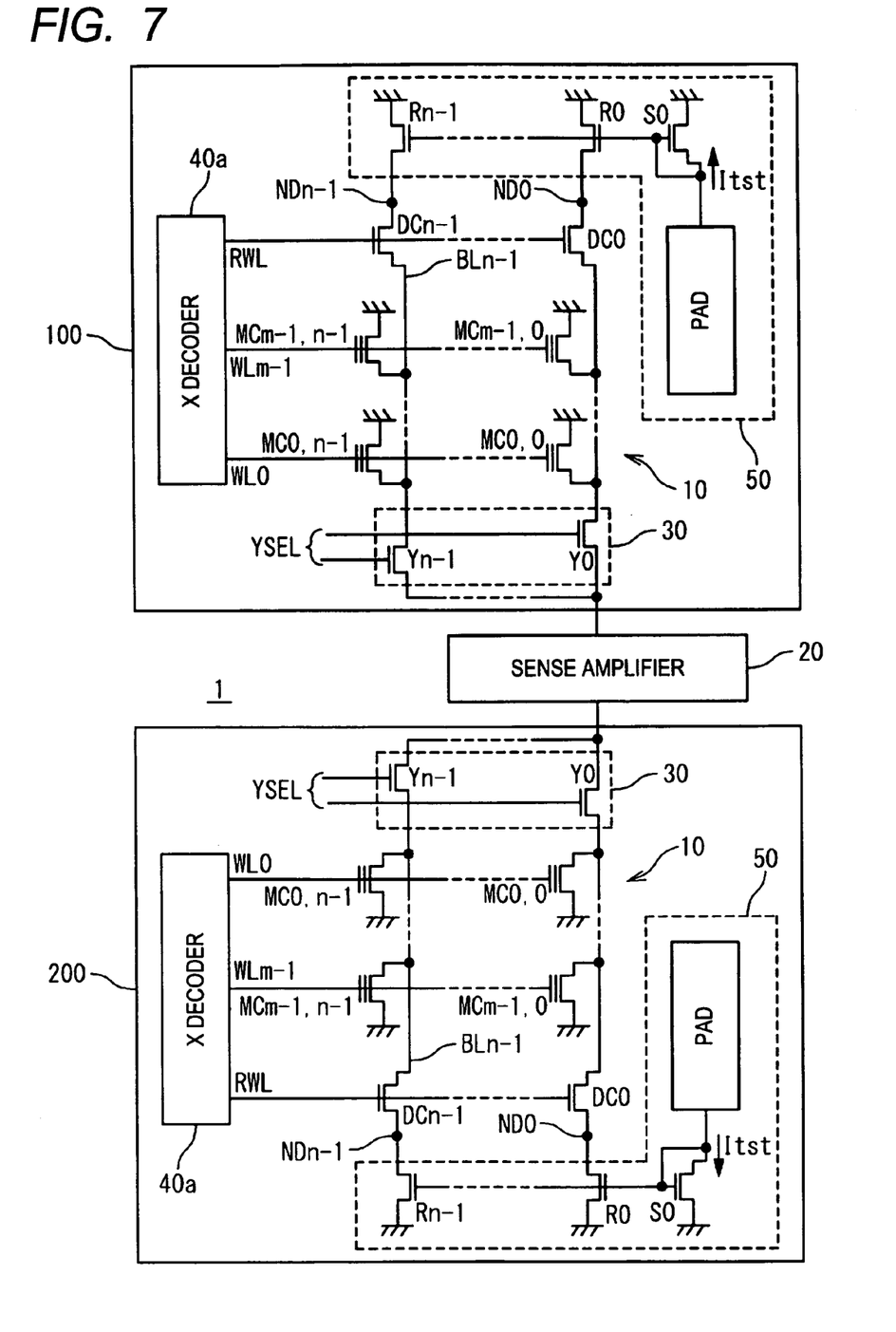
FIG. 7 is a circuit diagram illustrating the configuration of a nonvolatile semiconductor memory device in a second embodiment of the invention.

FIG. 7 is a circuit diagram illustrating the configuration of a nonvolatile semiconductor memory device 1 in the second embodiment. According to this embodiment, a first block 100 and a second block 200 are symmetrically provided with a sense amplifier 20 in between. The first block 100 and the second block 200 have the same configuration. That is, each of the first block 100 and the second block 200 includes a cell array 10, a Y selector 30, an X decoder 40a, and a current generating circuit 50. The cell arrays 10, Y selectors 30, and current generating circuits 50 are the same as those in the first embodiment.

Figure 8:
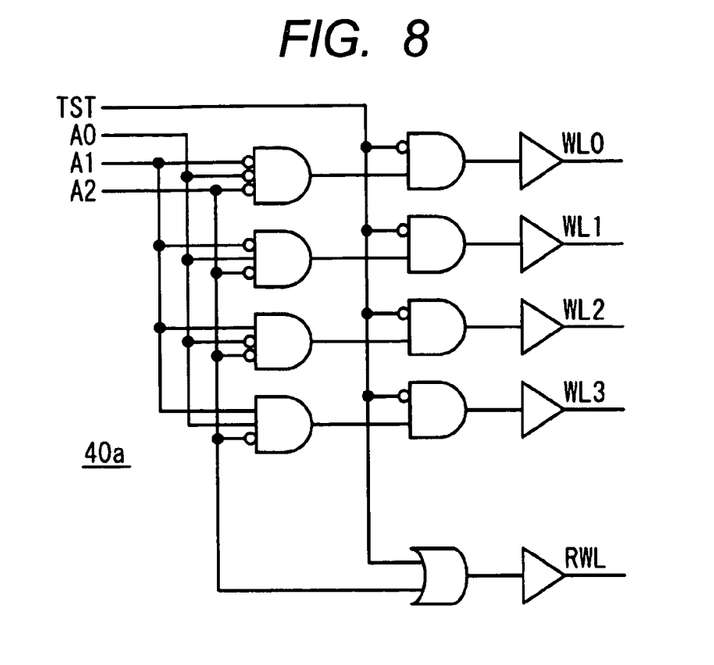
FIG. 8 is a circuit diagram illustrating an example of the configuration of the X decoder in the second embodiment.
Figure 9:
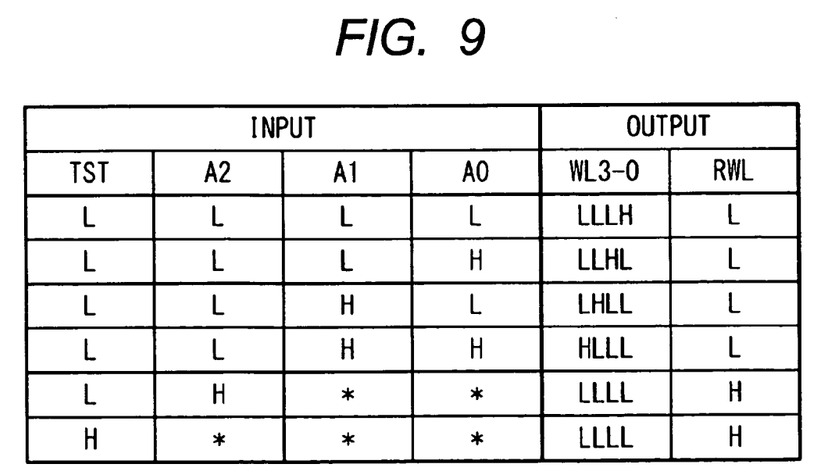
FIG. 9 is the truth table of the X decoder in the second embodiment.

FIG. 8 illustrates an example of the configuration of each X decoder 40a in this embodiment. FIG. 9 illustrates the truth table of each X decoder 40a in this embodiment. Unlike the X decoder 40 illustrated in FIG. 4 and FIG. 5, a block selection signal A2 is added to this embodiment. The block selection signal A2 is complementarily set for the first block 100 and the second block 200. More specific description will be given. When the block selection signal A2 for the first block 100 is set to the High level, the block selection signal A2 for the second block 200 is set to the Low level, and vice versa.

When the test signal TST is set to the Low level as an inactive level and the block selection signal A2 is set to the Low level as an inactive level, the X decoder 40a decodes the address signals [A1, A0] and selects any one of the word lines WL0 to WL3 as the selected word line. At this time, the dummy word line RWL is in a non-selected state. When the test signal TST is set to the Low level as an inactive level and the block selection signal A2 is set to the High level as an active level, the X decoder 40a selects the dummy word line RWL as the selected word line and brings all the word lines WL0 to WL3 into a non-selected state regardless of the address signals [A1, A0]. When the test signal TST is set to the High level as an active level, the X decoder 40a selects the dummy word line RWL as the selected word line and brings all the word lines WL0 to WL3 into a non-selected state regardless of the signals A0 to A2.

2-2. Operation 2-2-1. Usual Data Readout Operation

A case where the target of data readout is a memory cell transistor MCx,y included in the first block 100 will be taken as an example. The test signal TST is set to the Low level as an inactive level both in the first block 100 and in the second block 200. The block selection signal A2 is set to the Low level as an inactive level in the first block 100 and set to the High level as an active level in the second block 200.

The X decoder 40a in the first block 100 selects a selected word line WLs corresponding to the address signals and applies driving voltage to that selected word line WLs. When the selected cell transistor MCs continuing to the selected bit line BLs and the selected word line WLs is an "ON cell," an ON cell current is passed through the selected bit line BLs in the first block 100. When the selected cell transistor MCs is an "OFF cell," a cell current is hardly passed through the selected bit line BLs in the first block 100. Meanwhile, the X decoder 40a in the second block 200 selects the dummy word line RWL and applies driving voltage to the dummy word line RWL. As a result, the dummy cell transistors DCy are turned on and the above-mentioned test current Itst is passed through the selected bit line BLs in the second block 200.

According to this embodiment, this test current Itst passed through the second block 200 is used as the reference current Iref. The test current Itst passed at this time is set to an appropriate magnitude for the reference current Iref. The sense amplifier 20 compares the bit line current Ibit passed through the selected bit line BLs in the first block with the reference current Iref and outputs output data OUT corresponding to the result of the comparison. In this embodiment, as mentioned above, a block that is not the target of read functions as a reference current generating circuit.

2-2-2. Read Operation Test

Figure 10:
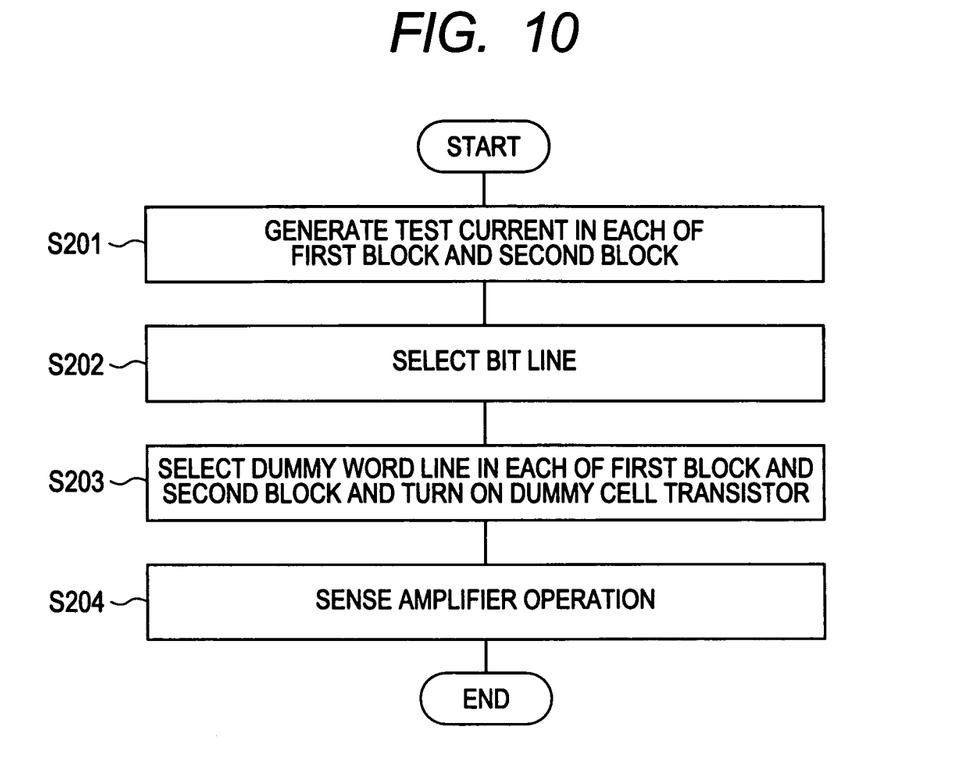
FIG. 10 is a flowchart illustrating a read operation test in the second embodiment.

FIG. 10 is a flowchart illustrating a read operation test in this embodiment.

Step S201:

The current generating circuit 50 is activated in each of the first block 100 and the second block 200 and the test current Itst is applied to the current nodes NDy. In this embodiment, the magnitude of the test current Itst is set to different values between the first block 100 and the second block 200 and the respective values are variable.

Step S202:

The Y selector 30 in each of the first block 100 and the second block 200 electrically couples the selected bit line BLs corresponding to the Y select signal YSEL to the sense amplifier 20.

Step S203:

The test signal TST is set to the High level in each of the first block 100 and the second block 200. As a result, the test current Itst is passed both in the first block 100 and in the second block as in the first embodiment.

Step S204:

In this embodiment, the test current Itst in either of the first block 100 and the second block is used as the reference current Iref. The sense amplifier 20 compares the test current Itst in the other block with the reference current Iref with predetermined timing. That is, in this embodiment, the sense amplifier 20 senses a difference in test current Itst between the first block 100 and the second block 200. The magnitude of the test current Itst in each of the first block 100 and the second block 200 can be variably set and various types of tests can be flexibly conducted.

2-3. Effect

According to this embodiment, the same effect as according to the first embodiment can be obtained. In addition, various types of tests can be flexibly conducted by varying the magnitude of the test current Itst in each of the first block 100 and the second block 200. Further, the current generating circuit 50 in each block carries out not only a test current Itst generating function but also a reference current Iref generating function. This is efficient and reduces the circuit area.

Up to this point, embodiments of the invention have been described with reference to the accompanying drawings. However, the invention is not limited to the above embodiments and can be appropriately modified by those skilled in the art without departing from the subject matter of the invention.

What is claimed is:

1. A nonvolatile semiconductor memory device comprising:
   a sense amplifier;
   a bit line coupled to the sense amplifier;
   a memory cell transistor;
   a dummy cell transistor;
   a current generating circuit supplying a test current to a first node,
   wherein either of the source and the drain of the dummy cell transistor is coupled to the bit line and the other is coupled to the first node,
   wherein either of the source and the drain of the memory cell transistor is coupled to the bit line and the other is coupled to another node,
   wherein a gate of said memory cell transistor is coupled to one of control signal lines and a gate of said dummy cell transistor is coupled to another one of control signal lines, and
   wherein either of the source and the drain of said memory cell transistor and the either of the source and the drain of the dummy cell transistor are electrically connected to each other regardless of the value of both said control signal lines;
   a first block; and
   a second block,
   wherein each of the first block and the second block includes the bit line, the memory cell transistor, the dummy cell transistor, the first node, and the current generating circuit, and
   wherein in a read operation test, the sense amplifier uses the test current in either of the first block and the second block as a reference current and compares the test current in the other of the first block and the second block with the reference current.

2. The nonvolatile semiconductor memory device according to claim 1, further comprising:
   a decoder,
   wherein the gate of the memory cell transistor is coupled to the decoder through a word line,
   wherein the gate of the dummy cell transistor is coupled to the decoder through a dummy word line,
   wherein in the read operation test, the decoder brings the word line into a non-selected state to turn off the memory cell transistor and brings the dummy word line into a selected state to turn on the dummy cell transistor, and wherein said one of control signal lines is said word line and said another one of control signal lines is said dummy word line.

3. The nonvolatile semiconductor memory device according to claim 1, wherein the dummy cell transistor has the same gate capacitance as the gate capacitance of the memory cell transistor.

4. The nonvolatile semiconductor memory device according to claim 1, wherein the dummy cell transistor has the same structure as the structure of the memory cell transistor.

5. The nonvolatile semiconductor memory device according to claim 1, wherein the magnitude of the test current in the read operation test is different between the first block and the second block.

6. The nonvolatile semiconductor memory device according to claim 1, wherein at the time of data readout from the memory cell transistor in the first block, the memory cell transistor and the dummy cell transistor in the first block are respectively turned on and off, and the memory cell transistor and the dummy cell transistor in the second block are respectively turned off and on, and wherein the sense amplifier uses the test current in the second block as the reference current and compares a cell current passed through the bit line in the first block with the reference current.

7. The nonvolatile semiconductor memory device according to claim 1, wherein in the read operation test, after the current generating circuit is activated, the dummy cell transistor is turned on, and the sense amplifier compares the test current passed through the bit line with the reference current and outputs output data corresponding to the result of the comparison.

8. The nonvolatile semiconductor memory device according to claim 1, wherein the test current is controlled by the current generating circuit.

9. The nonvolatile semiconductor memory device according to claim 1, wherein one of the source and the drain of the memory cell transistor is electrically connected to the bit line and the other one of the source and the drain of the memory cell transistor is electrically connected to another node different from the first node.

10. The nonvolatile semiconductor memory device according to claim 1, wherein one of the source and the drain of the memory cell transistor electrically communicates with the bit line and the other one electrically communicates with another node isolated from the first node.

* * * * *